United States Patent [19]
Ferrara

[11] 3,791,340
[45] Feb. 12, 1974

[54] METHOD OF DEPOSITING A METAL PATTERN ON A SURFACE

[75] Inventor: Anne Marie Ferrara, Princeton, Mercer County, N.J.

[73] Assignee: Western Electric Company Incorporated, New York, N.Y.

[22] Filed: May 15, 1972

[21] Appl. No.: 253,532

[52] U.S. Cl................... 117/47 A, 96/48 PD, 96/88, 106/1, 117/93.3, 117/130 E, 117/213
[51] Int. Cl............................................... B44d 1/50
[58] Field of Search.. 117/213, 138.8 R, 47 A, 93.3, 117/212, 130 E, 71 R; 96/88; 106/1

[56] References Cited

UNITED STATES PATENTS 3,657,003 4/1972 Kenney.............................. 117/213
3,562,005 2/1971 DeAngelo et al.................. 117/212

*Primary Examiner*—Ralph S. Kendall
*Assistant Examiner*—Michael W. Ball
*Attorney, Agent, or Firm*—J. Rosenstock

[57] ABSTRACT

A method of depositing a metal pattern on a surface of a substrate is disclosed. A surface of the substrate is sensitized with a photosensitive palladium sensitizer. The sensitized surface is exposed to a source of ultraviolet radiation to delineate an unexposed pattern corresponding to the desired metal pattern. The selectively ultraviolet radiation-exposed surface is then immersed in a suitable electroless metal deposition solution wherein an electroless metal is catalytically reduced on the delineated unexposed pattern.

11 Claims, 2 Drawing Figures

METHOD OF DEPOSITING A METAL PATTERN ON A SURFACE

BACKGROUND OF THE INVENTION

1. Field of the Invention

This invention relates to a method of depositing a metal pattern on a surface and more particularly, to a photographic-like method of depositing a metal pattern on an insulative surface utilizing a photosensitive palladium sensitizer.

2. Description of the Prior Art

The frequency of use of so-called circuit boards has in recent times increased greatly. The advantages of such boards need not be enumerated, because they are well known. Various methods for producing metallic patterns on substrates to produce the circuit boards are similarly well known. These methods include, alone or in various combinations, positive and negative printing processes, positive and negative silk screening processes, positive and negative etching techniques, electroplating and electroless plating.

Electroless plating has found great favor with many workers in the art and has, in fact, been known in at least rudimentary form since before 1845 (see *Symposium on Electroless Nickel Plating*, published by the American Society for Testing Materials as ASTM Special Technical Publication, No. 265 in November of 1959).

Generally speaking, electroless plating requires a so-called catalization step during which a substrate surface, to be electrolessly plated with a metal has placed thereon a material, usually a metal salt. This metal salt is capable of reducing the plated metal from an electroless bath without the use of an electrical current. Catalization by such a material (called a "catalyst" or "sensitizer") is referred to as such because the materials used, usually the salts of the precious metals (palladium, platinum, gold, silver, iridium, osmium, ruthenium, and rhodium) serve as reduction catalysts in an autocatalytic electroless plating process. Often, catalization is characterized as providing "nucleating sites" onto which the plated metal is "brought down" by a chemical reduction, or more generally, by a redox reaction. See, for example, U.S. Pat. Nos. 3,119,709 and 3,011,920.

Refinements of the basic electroless plating technique are necessary when the plated metal is electrolessly plated onto selected portions of a substrate surface in a pattern, rather than on the entire surface, to produce a circuit board. One such refinement is the novel additive, photoselective metal deposition process of M. A. DeAngelo et al., U. S. Pat. No. 3,562,005. In the novel DeAngelo et al. additive process of metallic pattern generation, patterns are generated without etching or photoresist masking. Specifically, a solution, called a "photopromoter" which has (or at least a part of which has) the ability to be retained on a substrate is applied to the substrate. The "photopromoters" revealed in DeAngelo et. al. are solutions comprising either Sn, Ti, Pb, Fe, or Hg ions. The retained photopromoter (Sn, Ti, Pb, Fe, or Hg ion containing) has a photopromoter species, i.e., the respective metal ion, which is capable of changing oxidation state upon exposure thereof to appropriate radiation. In one oxidation state (but not both) the photopromoter species is able to reduce, from a salt solution thereof, a precious metal (there defined as palladium, platinum, gold, silver, osmium, indium, iridium, rhenium, rhodium). The precious metal initiates an autocatalytic plating process.

After the substrate retains some of the photopromoter, it is selectively exposed to the appropriate radiation, specifically ultraviolet radiation of short wavelength and below 3,000A. THis exposure renders some portions of the substrate able to reduce the precious metal and rendering other portions not so capable. Subsequently, electroless metal is deposited only where it is desired, i.e., on the reduced precious metal.

Some potential photopromoters do not exhibit "practical wetting" of desirable substrates. "Practical wetting" is defined as the ability of a surface to retain, on a substantially macroscopically smooth, unroughened portion thereof, a continuous, thin, uniform layer of a liquid, such as water or other liquid medium, when the surface is held vertically, or in any other orientation. To eliminate this problem, the novel DeAngelo et. al. additive process of metallic pattern generation may be employed with the novel method of an application of J. T. Kenney, Ser. No. 8,022, filed Feb. 2, 1970, and assigned to the assignee hereof. The Kenney application discloses methods of rendering a non-wettable surface wettable, so that all the DeAngelo et al. photopromoters can be used therewith.

The revelations of DeAngelo et. al. and Kenney have led to research in an effort to discover a composition which is both photosensitive and capable of wetting a hydrophobic surface, e.g., a plastic surface. One such composition has been discovered and comprises an aqueous solution which (1) comprises a Pd containing species, which is photosensitive and can be photopatterned for an ultimate deposition of catalytic metallic Pd, and (2) is capable of wetting the hydrophobic surface.

SUMMARY OF THE INVENTION

This invention relates to a method of depositing a metal pattern on a surface and more particularly, to a photographic-like method of depositing a metal pattern on an insulative surface utilizing a photosensitive palladium sensitizer.

A surface of a suitable substrate is sensitized with a photosensitive palladium sensitizer or catalyst comprising a palladium species which in its initial state is capable of participating in an electroless metal deposition catalysis, e.g., by subsequently forming catalytic palladium metal, but which upon exposure to a source of ultraviolet radiation is rendered incapable of participating in an electroless metal deposition catalysis. The sensitized surface is selectively exposed to a suitable source of ultraviolet radiation to delineate an unexposed surface pattern corresponding to a desired electroless metal pattern. The selectively ultraviolet radiation exposed surface is then exposed to a suitable electroless metal deposition solution, comprising a suitable reducing agent, e.g., $$\mathrm{H\overset{O}{\overset{\|}{C}}{-}H}$$

and metal ions destined to be reduced, e.g., $Cu^{+2}$, to catalytically reduce an electroless metal, e.g., Cu, on the delineated pattern. The electroless metal deposited pattern may be further built up by conventional electrodeposition and the resultant metal deposit may be used as a circuit pattern of a circuit board.

DESCRIPTION OF THE DRAWING

The present invention will be more readily understood by reference to the following drawing taken in conjunction with the detailed description, wherein.

DETAILED DESCRIPTION

Figures 1, 2:
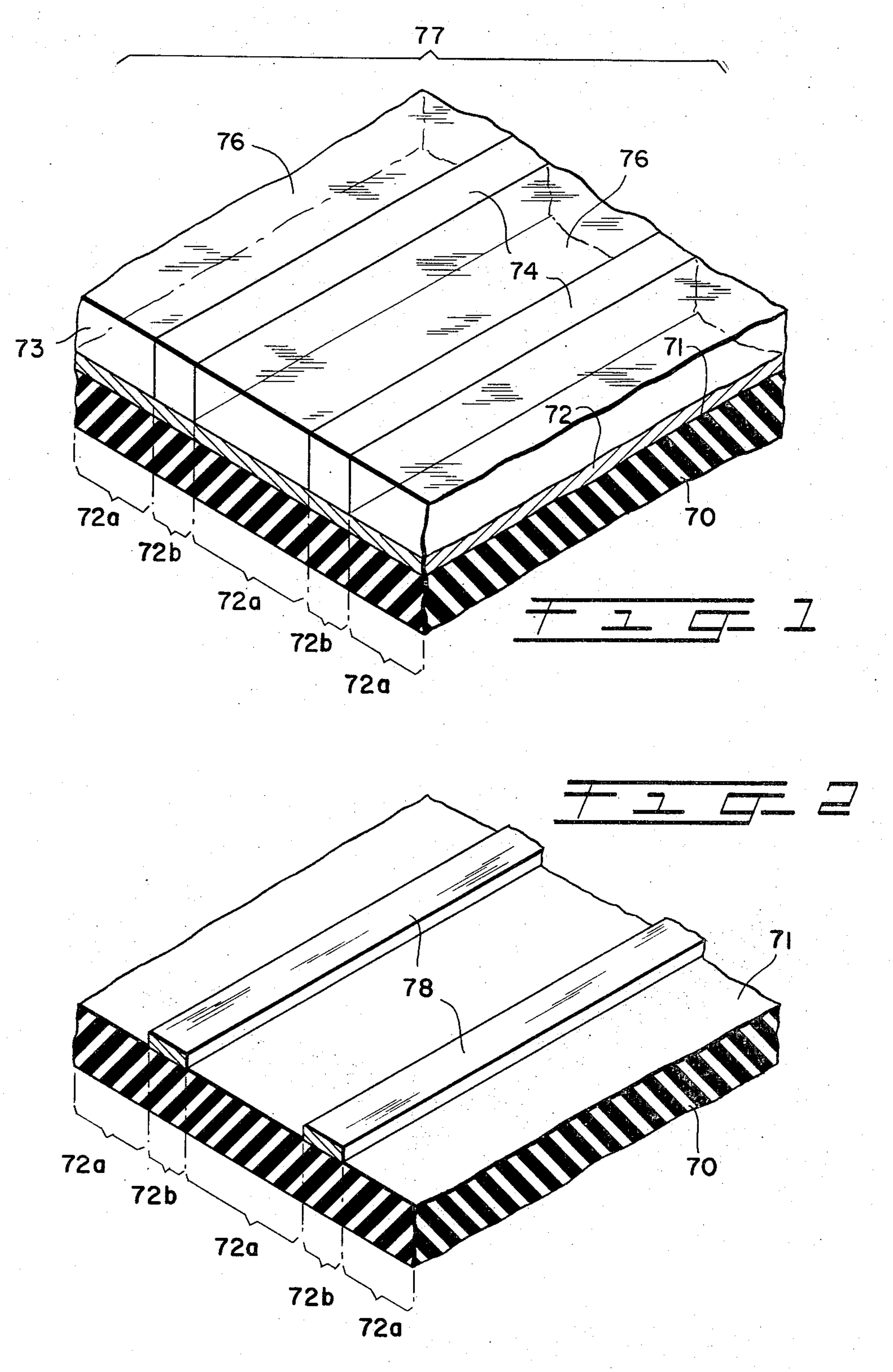
FIG. 1 is a partial isometric view of a portion of a typical substrate having a surface coated with a photosensitive palladium sensitizer layer of the present invention.
FIG. 2 is a partial isometric view of the portion of the substrate of FIG. 1 after a metallic pattern has been photoselectively deposited thereon by the novel method of the present invention.

The present invention has been described primarily in terms of depositing Cu on a surface of an insulative substrate. It will be readily appreciated that the inventive concept is equally applicable to depositing other suitable metals, which are catalytically reduced from their respective ions by catalytic palladium metal.

Referring to FIG. 1, there is shown a portion of a suitable substrate 70. For the production of electrical circuit patterns, suitable substrates are those which are generally nonconductive. In general, all dielectric materials are suitable substrates. The substrate 70 is sensitized by applying a suitable photosensitive palladium sensitizer or catalyst to a surface 71 of the substrate to form a photosensitive palladium sensitizer layer or coat 72.

Sensitization, as defined herein, is a process of depositing a palladium species on the surface 71 which is capable of participating in an electroless deposition catalysis, either by initially existing as catalytic palladium metal [Pd°] or by subsequently being converted into or forming catalytic palladium metal. By catalytic palladium metal is meant palladium metal which serves as a reduction catalyst in an autocatalytic electroless plating. A palladium sensitizer, as defined herein, comprises the palladium sensitizing species which can initially exist (1) as a catalytic atomic species, i.e., catalytic palladium metal [Pd°]; or (2) as a catalytic ionic species, e.g., $Pd^{+2}$ ions, which is subsequently converted into catalytic palladium metal, as by reduction with a suitable reducing agent, e.g., $Sn^{+2}$, $$H\overset{\overset{O}{\|}}{C}-H$$

hydrazine, etc.; or (3) as both a catalytic atomic species and a catalytic ionic species. A photosensitive palladium sensitizer is defined herein as comprising a palladium sensitizing species which in its initial state is capable of participating in an electroless metal deposition catalysis, i.e., is capable of acting as a palladium sensitizer, but which upon exposure to a suitable source of ultraviolet radiation is rendered incapable of participating in an electroless metal deposition catalysis.

Suitable photosensitive palladium sensitizers have been found to be colloidal palladium species containing solutions, where the palladium species exists as ionic palladium (associated, e.g., as insoluble particles of a hydrous oxide of palladium, or dissociated, e.g., as ionized palladium ions such as $Pd^{+2}$, or as a mixture of both). Specifically, some suitable palladium solutions which act as photosensitive palladium sensitizers are colloidal palladium wetting solutions disclosed in Kenney, Ser. No. 8,022, now U.S. Pat. No. 3,657,003 assigned to the assignee hereof and incorporated by reference herein. Such wetting solutions are designated therein as Examples XIII-A and XIII-B. These wetting solutions are generally described as stable colloidal solutions formed by a controlled hydrolysis and nucleation reaction in an aqueous medium wherein colloidal particles of the colloidal wetting solution (1) have a size within the range of 10A to 10,000A and (2) comprise an insoluble hydrous oxide of palladium. The term "hydrous oxide" is defined in Kenney, referred to above, namely as an insoluble oxide, an insoluble hydroxide, an insoluble oxide-hydroxide, or an insoluble mixture of an oxide and a hydroxide (including all permutations and combinations of the oxides and/or hydroxides revealed in Kenney). The hydrolysis reaction includes dissolving a salt of palladium in the aqueous medium and maintaining the pH of the aqueous medium at a point where no flocculate results.

Ordinarily, the palladium species (associated, e.g., an insoluble hydrous oxide of palladium, dissociated, e.g., $Pd^{+2}$ ions) contained in the palladium wetting solution (Kenney's Examples XIII-A — XIII-B) is capable of participating in an electroless metal deposition catalysis, i.e., is capable of forming catalytic palladium metal (palladium metal capable of functioning as a reduction catalyst in an autocatalytic electroless process), e.g., by being reduced thereto by a suitable reducing agent such as $Sn^{+2}$ ions or $$H\overset{\overset{O}{\|}}{C}-H$$

However, upon exposure to a suitable source of ultraviolet radiation the palladium species contained in the palladium wetting solution is no longer capable of participating in an electroless metal reduction catalysis. A suitable source of ultraviolet radiation being a source of ultraviolet radiation having a wavelength ranging from 1,800A to 2,900A.

There is no explanation for the above phenomenon. It is not known what photoreaction takes place or what product, i.e., palladium species, is obtained by such a photoreaction. It is difficult to conceive what possible product or palladium species is obtained which cannot be reduced by a suitable reducing agent, such as $$H\overset{\overset{O}{\|}}{C}-H$$

(alone or combined in an electroless plating solution), to catalytic palladium metal. However, the product obtained by exposure of the palladium wetting solution is one which is not reduced by a reducing agent, such as $$H\overset{\overset{O}{\|}}{C}-H$$

(alone or combined in an electroless plating solution), to catalytic palladium metal. The photoreaction product is not capable of participating in any fashion in the catalytic reduction of an electroless metal ion.

It is to be pointed out and stressed at this point that it is critical that the palladium sensitizers exist in a colloidal state, if such is not the case, then the palladium sensitizers cannot function photochemically, i.e., they are not photosensitive in the manner described above. It is also to be pointed out and stressed that the colloidal palladium sensitizers are very long lived, i.e., the colloidal palladium sensitizers retain their photosensitivity for a relatively long period of time, typically from several weeks to months.

Referring again to FIG. 1, a suitable mask 73 is placed contiguous to the photosensitive palladium sensitizer layer 72. The mask 73 is a positive mask, i.e., has areas 74 which are opaque to a desired radiation to which the positive mask 73 and, ultimately, layer 72 is destined to be exposed, which areas correspond to a desired electroless metal-deposited pattern. The positive mask 73 has areas 76 which are capable of transmitting therethrough the desired radiation to which the positive mask 73 and layer 72 is destined to be exposed. It should be noted that in the alternative, separate masking areas may be applied to layer 72, utilizing standard materials and techniques known in the art.

A radiation source 77, e.g., an ultraviolet radiation source having a wavelength ranging from 1,800A to 2,900A, is placed above the mask 73 and directed thereat. A plurality of rays having a wavelength ranging from 1,800A to 2,900A passes through or is transmitted through areas 76 of the mask 73 to expose areas 72(*a*) of the photosensitive palladium sensitizer layer 72 thereto. The thus exposed areas 72(*a*) of the palladium sensitizer layer 72, underlying and corresponding to areas 76 of the positive mask 73, are incapable of participating in a catalytic reduction of electroless metal ions to which the radiation exposed substrate 70 is destined to be exposed. In other words, a first palladium species (ionic), capable of being reduced to catalytic palladium, contained on areas 76 is transformed into a second palladium species (ionic and/or atomic) which is incapable of being reduced to catalytic palladium metal. What the second species is cannot be determined at this point in time. The remaining areas 72(*b*) of the palladium sensitizer layer 72, corresponding to areas 74 of the positive mask 73, which have not been exposed, comprise thereon the first palladium species which retains or possesses the ability to participate in an electroless metal deposition catalysis to which the substrate 70 is destined to be exposed. A sensitizer pattern or outline delineated by ultraviolet radiation exposure, which is capable of participating in the catalytic reduction of an electroless metal from a suitable electroless plating solution is thus established.

It is to be pointed out at this point, that the surface 71 is exposed to the ultraviolet radiation source 77 for a period of time sufficient to render areas 76 incapable of participating in an electroless metal deposition catalysis, whereby the catalytic palladium metal forms which renders such catalysis. Such a period of time is readily ascertained experimentally by one skilled in the art for a particular ultraviolet radiation source. It is to be noted, however, that the time of exposure is interdependent upon the intensity of the source 77, i.e., upon the amount of energy transmitted by the source 77 to the surface 71. This interdependency is well known in the art or is easily ascertained by one skilled therein. The amount of energy supplied to the substrate surface 71 by the source 77, however, is not found to be critical and a typical exposure may range from 30 to 60 minutes at an intensity ranging from 4$\mu$ watts/cm$^2$ to 30$\mu$ watts/cm$^2$ (at wavelengths ranging from 2,000A to 2,900A).

The radiation-exposed substrate 70 is immersed in a suitable electroless metal deposition solution wherein, sequentially, (1) catalytic palladium metal is formed on areas 72(*b*) and (2) an electroless metal ion, e.g., $Cu^{+2}$, is reduced to the metal, e.g., Cu, and deposited on areas 72(*b*) of the substrate 70 to form an electroless metal deposit 78 (as shown in FIG. 2). A suitable electroless metal deposition solution comprises a metal ion, e.g., $Cu^{+2}$, which is catalytically reduced to its corresponding metal, e.g., Cu, by a suitable reducing agent e.g., $$\mathrm{H}\overset{\overset{\displaystyle\mathrm{O}}{\|}}{\mathrm{C}}\mathrm{-H}$$

in the presence of catalytic Pd metal. A suitable reducing agent is one which (1) is capable of reducing palladium ions (unexposed to ultraviolet radiation) to catalytic palladium metal and (2) is capable of reducing the electroless metal ions to the corresponding electroless metal. The electroless metal deposition 78 may then be further built up or electroplated in a standard electroplating bath.

It is to be noted that the various typical electroless and electroplating solutions, plating conditions and procedures are well known in the art and will not be elaborated herein. Reference in this regard is made to *Metallic Coating of Plastics*, William Goldie, Electrochemical Publications, 1968.

It is also to be noted, that the invention disclosed herein may be employed in the production of electrical circuit patterns on a nonconductive substrate, in a similar fashion to that revealed in U. S. Pat. No. 3,562,005, assigned to the assignee hereof and incorporated by reference herein. In this regard, referring back to FIG. 1, areas 72(*b*) of the palladium sensitizer layer 72 constitute a portion of a pattern conforming to a desired electrical circuit pattern. Referring to FIG. 2, the electroless deposit 78 obtained constitutes a portion of the electrical circuit pattern. The resulting electrical circuit pattern, represented by deposit 78, may be electroplated to a desired thickness whereafter the desired circuit pattern may be removed from the substrate 70 by appropriate means known in the art.

EXAMPLE I

A. A colloidal palladium photosensitive sensitizer was prepared by adding 0.5 grams of $PdCl_2$ to 200 mls. of deionized water. The resultant solution was stirred for 16 hours until the solution underwent a color change from red-brown to dark brown, whereby a colloidal suspension was obtained. The resultant colloidal solution (comprising a hydrous oxide of palladium) is a wetting solution and will wet a hydrophobic polyimide surface and a hydrophobic polytetrafluorethylene surface.

A 2 mil thick polyimide substrate, commercially obtained, was etched for 10 minutes in 10N NaOH (with ultrasonic agitation). The substrate was immersed in the colloidal palladium sensitizer for one minute, followed by a 30-second rinse in flowing deionized water. The substrate was dried in a nitrogen gas stream and selectively exposed for 60 minutes to a low-pressure mercury discharge lamp (30$\mu$ watts/cm$^2$ surface at 2,537A) through a positive quartz mask. The mask had opaque areas through which the ultraviolet radiation did not pass, such opaque areas corresponding to a desired electroless metal-deposited pattern. The substrate was then immersed in an electroless plating bath, comprising copper sulfate, formaldehyde, complexer and caustic, wherein an electroless copper pattern, corresponding to unexposed areas of the substrate and to the opaque areas of the mask, having a thickness of about 20 microinches was obtained. There was no electroless copper deposited on those areas of the substrate exposed to the source of ultraviolet radiation. The resultant electroless copper pattern was immersed in a $Cu(BF_4)_2$ plating solution at 75 amps./ft.$^2$ to obtain a copper pattern having a thickness of 5 mils.

Electron beam diffraction patterns of the palladium sensitizer, both before and after ultraviolet radiation exposure, were taken utilizing a standard technique known in the art. The patterns, taken of the sensitizer prior to ultraviolet exposure, revealed rings corresponding to a hydrous palladium oxide and palladium metal. Also present were diffraction rings which could not be identified. The patterns, taken of the sensitizer after ultraviolet radiation exposure, revealed rings corresponding to a hydrous palladium oxide and to palladium metal. The unidentified rings were still present but were less intense. It is hypothesized that the palladium metal results, in both instances, from the decomposition of the hydrous palladium oxide caused by the vacuum employed in the diffraction study combined with the heat produced from the electron beam.

B. The procedure of Example I-A was repeated except that the palladium sensitizer was prepared in the following manner. A 10 ml. sample of a 5 weight percent $PdCl_2$ in HCl solution (at a pH of 0.7) was added to 200 ml. of deionized water. The initial pH of 2.0 was adjusted to a range of 3.0 to 3.2 with 1N-NaOH. The resultant dark red solution was a colloidal palladium species containing solution. A 5.0 mil thick copper pattern was obtained. There was no copper deposited on those areas of the substrate exposed to the ultraviolet radiation source. Electron diffraction studies of the sensitizer gave results similar to those in Example I-A.

C. The procedure of Example I-B was repeated except that the pH was not adjusted and a non-colloidal solution resulted. Upon immersion in the electroless plating solution, a spotty, blanket copper deposit was obtained. An electroless copper pattern, conforming only to the opaque portions of the positive quartz mask, was not obtained.

D. The procedure of Example I-B was repeated except that the polyimide substrate was not etched. A resultant 5.0 mil thick copper pattern corresponding to the opaque areas of the positive quartz mask was obtained. The copper pattern exhibited good adhesion.

E. The procedure of Example I-D was repeated except the sensitizer solution was that of Example I-C. An electroless copper deposit was not obtained. If there was a deposit it did not adhere to the unetched polyimide surface.

F. The procedure of Example I-A was repeated except that after drying the sensitized substrate, the substrate was stored away from light for three days. The substrate was then selectively exposed to the ultraviolet radiation source for 15 minutes. A 5.0 mil resultant copper pattern was obtained.

G. The procedure of Example I-A was repeated except that the substrate was exposed to a 900-watt Xe light source for 30 minutes. The intensity of the light source was 8$\mu$ watts/cm$^2$ ($\gamma$ = 2,500A). A resultant 5.0 mil copper pattern was obtained.

H. The procedure of Example I-G was repeated except that there was a 60 minute exposure to the Xe light source. A resultant 5.0 mil copper pattern was obtained.

I. The procedure of Example I-G was repeated except that an ultraviolet absorbing, visible light transmitting filter was employed. After a 60 minute exposure a copper pattern was not obtained but rather blanket copper deposition of the polyimide substrate.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of depositing a metal pattern on a surface of a substrate, which comprises:

a. sensitizing the surface with a photosensitive colloidal palladium sensitizer;

b. selectively exposing said sensitized surface to a source of ultraviolet radiation to delineate an unexposed pattern corresponding to the desired metal pattern; and c. exposing said selectively exposed surface to a suitable electroless metal deposition solution to catalytically reduce an electroless metal on said delineated unexposed pattern.

2. In a method of selectively depositing a metal pattern on a surface of a substrate, which comprises:

a. coating the surface with a colloidal palladium species which upon exposure to a source of ultraviolet radiation is rendered incapable of participating in an electroless metal deposition catalysis; and b. selectively exposing said coated surface to a source of ultraviolet radiation to delineate an unexposed coated surface pattern corresponding to the metal pattern desired.

3. The method as defined in claim 2 which further comprises:

exposing said unexposed coated surface pattern to an electroless metal deposition solution to deposit an electroless metal thereon.

4. The method as defined in claim 3 which further comprises:

electrochemically depositing a metal deposit on said electroless metal.

5. A method of selectively depositing a metal pattern on a surface of a substrate, which comprises:

a. coating the surface with a stable aqueous colloidal solution, formed by a hydrolysis and nucleation reaction, comprising insoluble hydrous oxide particles of palladium, said particles having a size within the range of 10A to 10,000A and said hydrolysis reaction including at least (1) dissolution of a salt of palladium in an aqueous medium and (2) maintenance of the pH of said aqueous medium at a point where no flocculate results;

b. exposing selected portions of said coated surface to a source of ultraviolet radiation to render palladium species contained on said selected portions incapable of being reduced to catalytic palladium metal, said selected portions conforming to a negative of the pattern; and c. immersing said selectively exposed surface in an electroless metal plating bath to sequentially (1) form catalytic palladium metal and (2) reduce an electroless metal thereon, said reduction being catalyzed by said formed catalytic palladium metal.

6. In a method of rendering a first ionic palladium species, capable of being reduced to catalytic palladium, incapable of participating in an electroless metal deposition catalysis, which comprises:

exposing a colloidal solution comprising said first species to a source of ultraviolet radiation to form a second palladium species incapable of being reduced to catalytic palladium metal.

7. A palladium species incapable of being reduced to catalytic palladium produced by the method of claim 6.

8. A method of rendering a first ionic species, capable of being reduced to catalytic palladium, incapable of participating in an electroless metal catalysis, which comprises:

a. preparing a stable aqueous colloidal solution, comprising the first species, by:

a¹. forming an aqueous solution of a palladium salt, including the sub-steps of:

1. adjusting the pH of an aqueous medium to a value which prevents formation of a spontaneous precipitate upon dissolution in said medium of said palladium salt; and
2. dissolving said palladium salt in said medium to produce a salt solution;

b¹. producing a colloidal solution by forming a colloidal, solid phase in said salt solution, said colloidal, solid phase comprising insoluble hydrous oxide particles of palladium, said particles having dimensions ranging from 10A to 10,000A, including at least the sub-steps of:

1. effecting a hydrolysis and nucleation reaction of said dissolved salt in said salt solution; and
2. maintaining the pH of said salt solution at a value which prevents a spontaneous precipitate; and p1 b. exposing said colloidal solution to a source of ultraviolet radiation to form a second palladium species incapable of participating in an electroless metal catalysis.

9. A method of producing an electrical circuit pattern on a non-conductive substrate, which comprises:

a. coating the substrate with a photosensitive colloidal palladium species, which is initially capable of being reduced to catalytic palladium metal but which upon exposure to ultraviolet radiation is rendered incapable of such reduction;

b. selectively exposing said coated substrate to a source of ultraviolet radiation to generate a first surface pattern conforming to the electrical circuit pattern, and a second surface pattern, said first surface pattern comprising palladium species thereon capable of reduction to catalytic palladium metal, said second surface pattern comprising palladium species thereon incapable of reduction to catalytic palladium metal; and c. immersing said selectively exposed substrate in an electroless plating bath, catalyzed by catalytic palladium metal, to deposit electroless metal on said first surface pattern to produce the electrical circuit pattern.

10. The method as defined in claim 9 which comprises the additional step of electroplating metal onto said electrical circuit pattern.

11. The method as defined in claim 10 which comprises the additional step of removing the substrate from said electroplated circuit pattern.

* * * * *

UNITED STATES PATENT OFFICE
CERTIFICATE OF CORRECTION

Patent No. 3,791,340 Dated February 12, 1974

Inventor(s) A. M. Ferrara

It is certified that error appears in the above-identified patent and that said Letters Patent are hereby corrected as shown below:

In the specification, Column 2, line 8, "THis" should read --This--. Column 8, line 4, "$\gamma$" should read --$\lambda$--.

In the claims, Column 10, line 6, claim 8, "pl b" should read --(b)-- and it should also begin a new paragraph.

Signed and sealed this 11th day of June 1974.

(SEAL)
Attest:

EDWARD M.FLETCHER,JR.
Attesting Officer

C. MARSHALL DANN
Commissioner of Patents